(12) United States Patent
Cho

(10) Patent No.: US 6,781,399 B2
(45) Date of Patent: Aug. 24, 2004

(54) ON-CHIP ADC TEST FOR IMAGE SENSORS

(75) Inventor: Kwang-Bo Cho, Los Angeles, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/222,773

(22) Filed: Aug. 16, 2002

(65) Prior Publication Data

US 2003/0067319 A1 Apr. 10, 2003

Related U.S. Application Data

(60) Provisional application No. 60/313,122, filed on Aug. 16, 2001.

(51) Int. Cl.[7] .............................................. G01R 31/26
(52) U.S. Cl. ..................................................... 324/765
(58) Field of Search .......................... 324/158.1, 76.47, 324/76.82, 537, 771, 523, 527, 528, 533; 341/155, 162

(56) References Cited

U.S. PATENT DOCUMENTS 5,065,159 A * 11/1991 Kuwana ...................... 341/148
6,538,592 B1 * 3/2003 Yang et al. .................. 341/155

* cited by examiner

Primary Examiner—Evan Pert
Assistant Examiner—Trung Q Nguyen
(74) Attorney, Agent, or Firm—Dickstein Shapiro Morin & Oshinsky LLP

(57) ABSTRACT

The speed of on-chip ADC testing of image sensors is increased by testing multiple chips in parallel. A wafer typically contains many individual image sensor chips. In a parallel on-chip test procedure, power is applied to a plurality of the image sensor chips and the chips are then tested in parallel. Additional power lines may need to be added to the wafer to allow power to be supplied to a plurality of the image sensor chips at once. These power lines may be etched directly on the wafer, or a wafer master may be used to overlay the wafer with the power lines for testing purposes. Additionally, test engines may be added to the wafer map to control the overall test procedures.

7 Claims, 3 Drawing Sheets

ON-CHIP ADC TEST FOR IMAGE SENSORS

CROSS-REFERENCE TO RELATED APPLICATIONS

This application claims benefit of U.S. Provisional application No. 60/313,122, filed Aug. 16, 2001, the content of which is herein incorporated by reference in its entirety.

TECHNICAL FIELD

This invention relates to image sensors, and more particularly to on chip testing of image sensors.

BACKGROUND

Analog to digital converters (ADC) are conventionally used to convert analog signals to digital codes or signals for processing. Dedicated ADC chips can be readily tested in manufacturing by applying a known analog input to the chip and evaluating the digital output. Many current microelectronic circuit chips exist in which the ADC is integrated on a substrate with processors and other circuits. Embedded ADCs may be difficult and time-consuming to test in manufacturing. Testing requires access to the digital output data of the ADC to assess the behavior of the ADC. This may be difficult or impossible, particularly when testing at speed.

The ADC can be tested using static techniques. Digital data is accessed via a serial scan path. However, a 16-bit ADC may require a prohibitive number of scan downloads (from a tester or test time perspective) in order to verify that the ADC is functional for every digital code.

On the analog input side of ADC, ramp inputs have traditionally been a preferred technique to stimulate the ADC to output all of its digital output codes. This requires either special mixed signal automatic test equipment (ATE) or additional components on the tester to the device under test interface board.

For image sensors, the output of the ADC of a pixel array is based on the light condition and integration time. At a given light condition, an increase in integration time results in a linear increase in ADC output. As current sensors are mostly frame based, the integration time may only be changed by the frame rate. Thus, to completely perform an on-chip check an 8-bit ADC, it takes 255/30=8.5 sec at 30 frames per second. This is compared to approximately 0.5 seconds for an off-chip ADC test. A system that allows for on-chip ADC testing at an increased speed may be useful.

SUMMARY

The present invention increases the speed for on-chip ADC testing of image sensors by testing multiple chips in parallel. A wafer typically has many individual image sensor chips. A parallel on-chip test procedure is operated, power is applied to a plurality of the image sensor chips and the chips are then tested in parallel. Additional power inputs may be added to the wafer in order to allow power to be supplied to a plurality of the image sensor chips at once. These power lines may be etched directly on the wafer, or a wafer master may be used to overlay the wafer with the power lines for testing purposes. Additionally, test engines may be added to the wafer map to control the overall test procedures.

DESCRIPTION OF DRAWINGS

These and other features and advantages of the invention will become more apparent upon reading the following detailed description and upon reference to the accompanying drawings.

DETAILED DESCRIPTION

Figure 1:
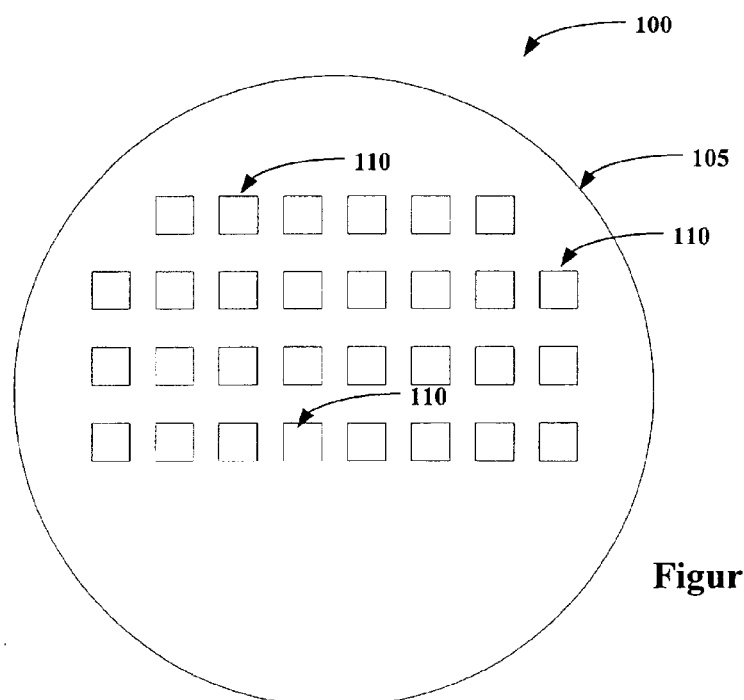
FIG. 1 illustrates a wafer map having an image wafer and a plurality of chips.

FIG. 1 illustrates a wafer map 100 having an image wafer 105 and a plurality of separable chips 110 arranged linearly. Each image wafer 105 is used to manufacture image chips. A plurality of image chips 110 are formed during the manufacturing process on a single image wafer 105. A wafer map 100 is used to define the precise location of the image chips 110 on the wafer 105. Typically, it is desired to space the chips 110 close together to maximize the number of chips 100 produced on a wafer 105. However, certain characteristics may dictate the proximity of each of the plurality of chips 110. For example, to accommodate items such as seal rings and scribe lines, a typical wafer map 100 allows approximately 125 µm of space between each chip 110.

For on-chip testing of a plurality of ADCs of chips 110 in parallel, each of the chips 110 to be tested needs to be supplied with power. However, the typical wafer 105 having a plurality of chips 110 does not include any means to supply power to the chips 110.

Figure 2:
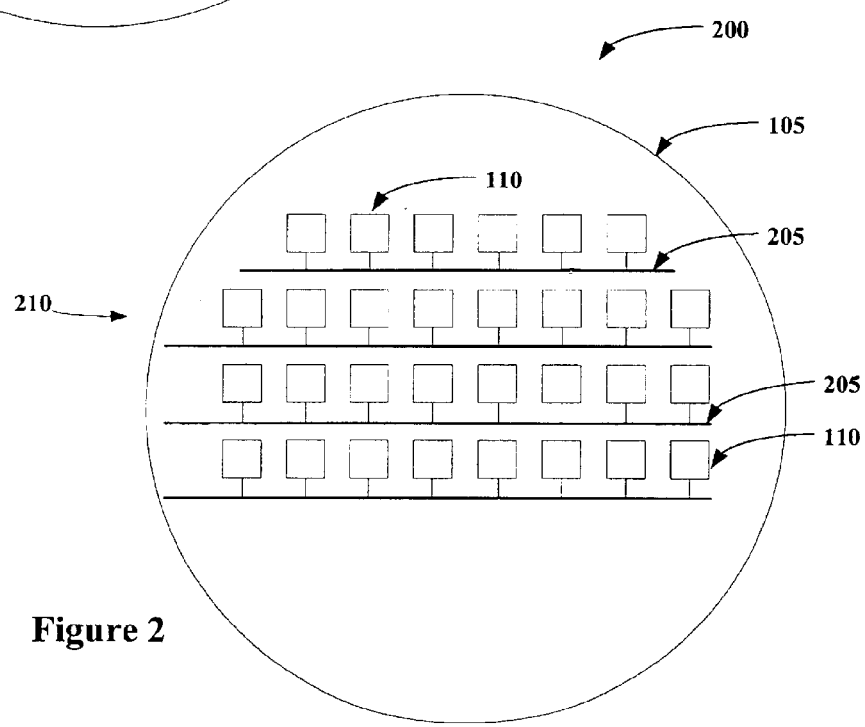
FIG. 2 illustrates a wafer map having an image wafer and a plurality of chips including additional power lines to simultaneously provide power to a group of the plurality of chips.

FIG. 2 illustrates a wafer map 200 having an image wafer 105 and a plurality of chips 110 including additional power lines 205 to simultaneously provide power to a group 210 of the plurality of chips 110. The power lines 205 may be included in the space allotted between each of the chips 110. Thus, the power lines 205 may be added to existing wafers 105 with very little modification to the wafer map. Each of the power lines 205 connects one group 210 of chips to a power source. Thus, the power source can simply supply power to a power line, to simultaneously power on all the chips 110 connected to the power line 205. In FIG. 2, the power lines 205 are shown connecting groups 210 of chips 110 in rows. However, it can be appreciated that the power lines 205 may be of any shape and may connect to multiple chips over the entire wafer 105.

Figure 3:
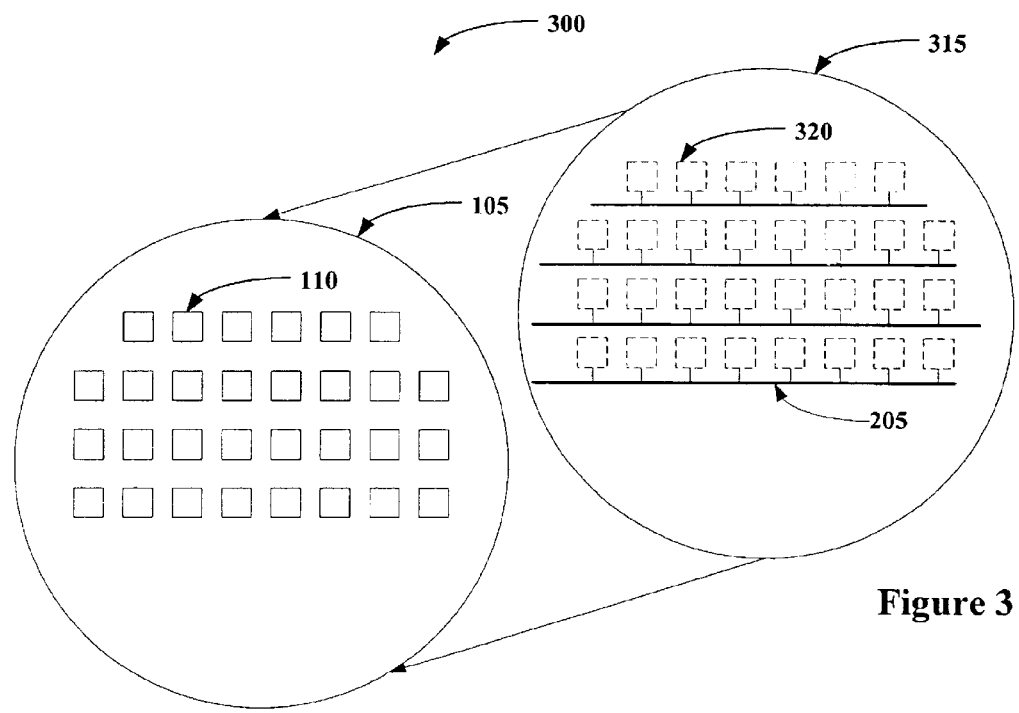
FIG. 3 illustrates a wafer test system including a wafer master template having power lines and an image wafer having a plurality of chips.

FIG. 3 illustrates a wafer test system 300 including a wafer master template 315 having power lines 205 and the image wafer 105 having a plurality of chips 110. The wafer test system 300 uses a standard image wafer 105 as described in FIG. 1. The wafer test system 300 may be used as an alternative to adding power lines 205 to the wafer 105. In the wafer test system 300, the wafer master template 315 is used in conjunction with the image wafer 105. The wafer master template 315 is formed to fit over the image wafer 105. The wafer master template 315 includes a plurality of vias 320 approximating the size and location of the chips on the wafer 105. One or more power lines 205 are included on the wafer master template 315 and connect to a group of vias 320. For testing, the wafer master template 310 is positioned over the image wafer 105 so that the plurality of image chips 110 correspond to the plurality of vias 320. When the wafer master template 315 is positioned over the image wafer 105, the image chips 110 fit into the vias 320 so that the power lines 205 on the wafer master template 315 interconnect a group of the image chips 110. Power may then be applied to the power lines 205 to power each group of image chips 110, allowing simultaneous testing of the group of image chips 110.

Figure 4:
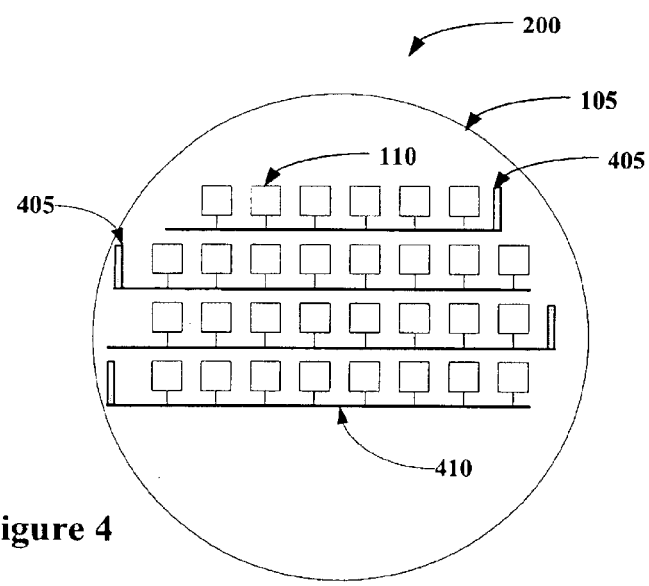
FIG. 4 illustrates the wafer map of FIG. 2 further including test engines.

FIG. 4 illustrates the wafer map 200 of FIG. 2 further including test engines 405. In addition to the power lines 205, additional control lines 410 may be included on the image wafer 105. These control lines 410 connect the test engines 405 to the image chips 110. The test engines may include firmware to control the overall test procedures of the image chips 110. By including the control lines 410 and test engines 405, the ADCs of the image chips 110 may be tested in parallel with a complete on-chip system. By testing the image chips 110 in parallel, on-chip testing may be performed with a much higher efficiency.

Figure 5:
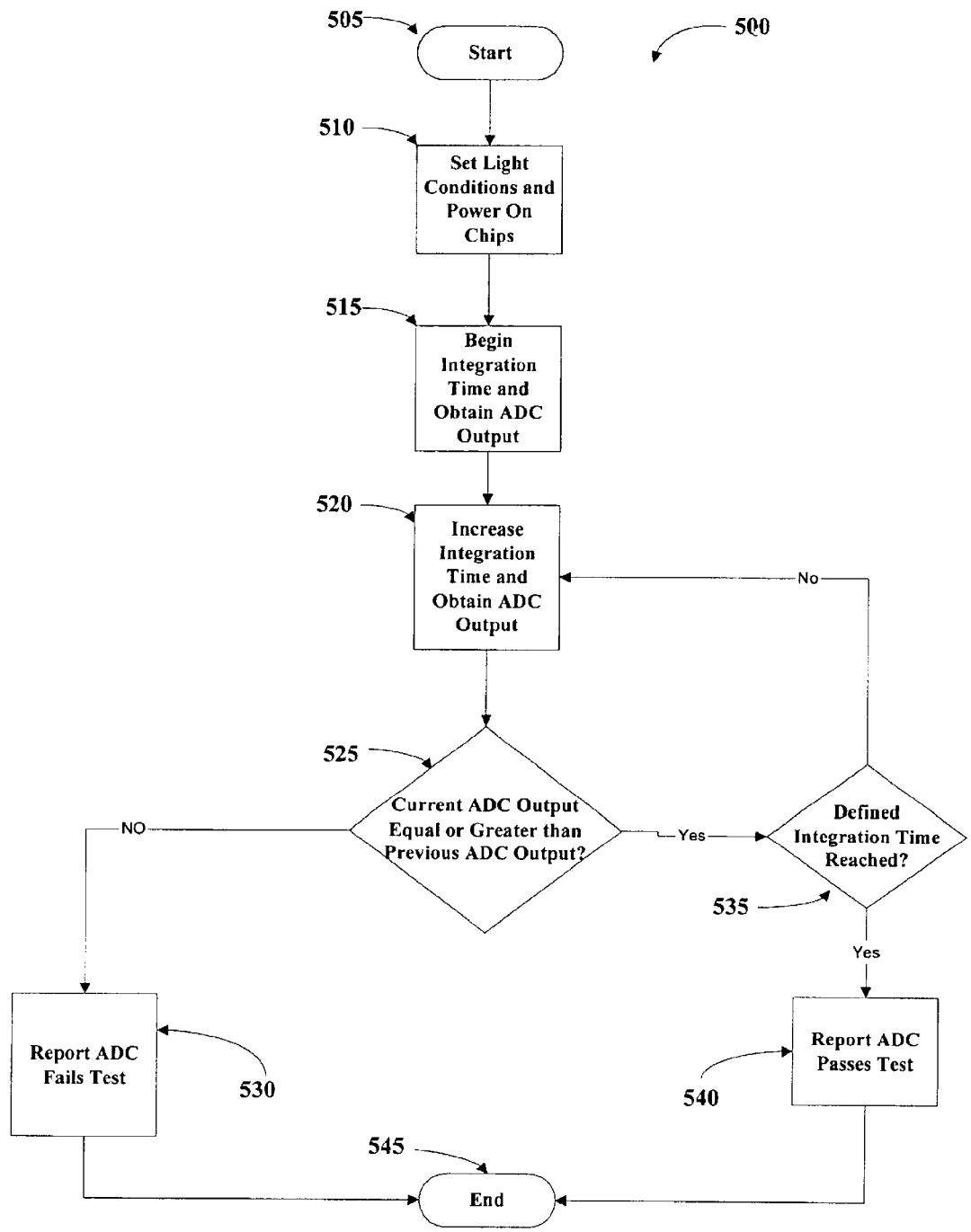
FIG. 5 illustrates a process for simultaneously testing the ADC of a plurality of chips on an image wafer.

FIG. 5 illustrates a test process 500 for simultaneously testing the ADC of a plurality of chips on an image wafer. The test process 500 may be incorporated into the firmware of the test engine 405 if included on a wafer 105. The test process 500 begins at a START block 505. Proceeding to block 510, the test process 500 sets a fixed light condition and provides power to a group of chips. The power may be provided by the power lines 205.

Proceeding to block 515, the test process 500 begins a short integration time and obtains the output of the ADC. The integration time is the time difference between the reset and the read signal to an image chip. For a pixel in the image chip, a reset signal is applied, and an initial reference state is established. After an integration time, the signal is read and the output obtained.

Block 520 illustrates the test process 500 increasing the integration time and obtaining a new ADC output. The integration time may be increased by an amount equal to one row. At a given light condition, an increase in the integration time generally results in a linear increase in the ADC output. Thus, if the ADC is functioning properly, the output of the ADC will increase.

Proceeding to block 525, the test process 500 determines if the current ADC output is equal or greater than the previous ADC output. Because of the relationship between integration time and the ADC output, any decrease in the ADC output would indicate a malfunctioning ADC. Thus, if the current ADC output is lower than the previous ADC output, the test process 500 proceeds along the NO branch to block 530. In block 530, the test process 500 reports the ADC has failed, and then the test process terminates in END block 545.

Returning to block 525, if the current ADC output is equal to or greater than the previous output, the test process 500 proceeds along the YES branch to block 535. In block 535, the test process 500 checks to see if a defined integration time has been reached. The integration time may be defined, for example, so as to check a desired number of pixel rows of the image chips 110. If the defined integration time has not been reached, the test process 500 proceeds along the NO branch back to block 520 to obtain a new ADC output and continue testing. If the defined integration time has been reached, the test process 500 proceeds along the YES branch to block 540 and reports the ADC has passed the test. The test process 500 then terminates in END block 545.

Numerous variations and modifications of the invention will become readily apparent to those skilled in the art. For example, although the system and method is shown using image chips, it can be appreciated that any chips may use such a system. For example, the test engine may be formed using any hardware or software technique including HDL, or any other. Accordingly, the invention may be embodied in other specific forms without departing from its spirit or essential characteristics.

What is claimed is:

1. A method of simultaneously testing analog-to-digital converters (ADC) on a plurality of chips on a wafer comprising:

connecting a first group of the plurality of chips to a first power line and connecting a second group of plurality of chips to a second power line;

applying a power signal to said first power line;

simultaneously running ADC test procedures on each of said first group of chips connected to said first of the power lines during said applying; and reporting test results for each of the chips in the first group.

2. The method of claim 1, further comprising repeating said applying said simultaneously running, and said reporting, for said second group and said second power line.

3. The method of claim 1, further comprising the test procedures comprising:

setting a light condition;

obtaining a first ADC output after a first integration time;

obtaining a second ADC output after a second integration time;

comparing the first ADC output to the second ADC output, wherein the test results are failed if the second ADC output is less than the first ADC output.

4. The method of claim 1, further comprising forming a test engine that embeds the test procedures.

5. The method of claim 1, wherein said connecting comprises including first and second power lines on the wafer.

6. The method of claim 1, wherein said connecting comprises connecting the plurality of chips said power lines by overlaying the wafer with a test template, wherein the test template includes the one or more power lines.

7. The method of claim 6, further comprising forming a test engine on said template that embeds the test procedures test engine.

* * * * *